United States Patent [19]

Kurtz et al.

[11] 4,412,203

[45] Oct. 25, 1983

[54] HOUSING AND INTERCONNECTION ASSEMBLY FOR A PRESSURE TRANSDUCER

[75] Inventors: Anthony D. Kurtz, Englewood; Joseph R. Mallon, Franklin Lakes, both of N.J.

[73] Assignee: Kulite Semiconductor Products, Inc., Ridgefield, N.J.

[21] Appl. No.: 301,108

[22] Filed: Sep. 10, 1981

[51] Int. Cl.³ .............................................. G01L 1/22
[52] U.S. Cl. ........................................... 338/4; 338/42
[58] Field of Search ......................................... 338/2-5, 338/7, 42; 73/708, 720, 721, 726, 727, DIG. 4; 357/26; 29/610 SG

[56] References Cited

U.S. PATENT DOCUMENTS

| | | | |
|---|---|---|---|
| 3,247,719 | 4/1966 | Chelner | 73/726 |
| 3,482,197 | 12/1969 | Kondo et al. | 73/726 X |
| 3,568,124 | 3/1971 | Sonderegger | 357/26 X |
| 3,817,107 | 6/1974 | Shimada et al. | 338/4 X |
| 3,841,158 | 10/1974 | Hunter | 73/721 |

*Primary Examiner*—C. L. Albritton
*Attorney, Agent, or Firm*—Arthur L. Plevy

[57] ABSTRACT

A housing comprises a first top cylindrical section having an internal hollow which is manifested by three concentric sections, each of a larger diameter to give the sidewall of the housing a step-like cross section. A transducer assembly is positioned within the hollow of the top section and bonded to the inner wall. An annular ring is positioned in the hollow within the second section and accommodates small diameter wires directed from said transducer assembly through the aperture and bonded to metallized land areas on the undersurface of the annular member. The metallized areas also contain a separate conductive post which is directed from the land areas. A second bottom housing accommodates tubular conductive members which are aligned with the post member. When the second housing is emplaced within the first housing the posts are positioned within the tubular conductor members where they are welded to the tubular members to form a permanent assembly. The housing provided is extremely rugged and is adapted for operation in deleterious environments.

10 Claims, 3 Drawing Figures

HOUSING AND INTERCONNECTION ASSEMBLY FOR A PRESSURE TRANSDUCER

BACKGROUND OF INVENTION

This invention relates to electromechanical transducers and more particularly to a housing and interconnection configuration to enable operation of such a transducer in a relatively deleterious environment.

Such transducers, especially those of the piezoresistive type, have found widespread use in many varying applications. The piezoresistive transducer employs at least one silicon resistive element mounted on a diaphragm. The resistance of the piezoresistive device varies according to the intensity or magnitude of an applied force. The force is usually applied to the relatively thin diaphragm member which may be fabricated from a semiconductor or metallic material and serves to deflect or displace the diaphragm to therefore cause the resistance of the piezoresistive element to change. These devices provide a reliable output which is proportional to the magnitude of the applied force or pressure. In modern applications, such transducers have found widespread use in the automotive and other industries. In various applications, the transducers have been employed to measure such quantities as manifold pressure, exhaust pressure and various other pressures and forces which are associated with the operation of an internal combustion engine or the operation of a motor vehicle in general. As one can imagine, based on this application, one requires an extremely reliable device which is relatively inexpensive.

While the art of transducers has progressed to a point where the piezoresistive devices are extremely reliable, one has to provide a rugged housing in order to mount the device within the operating environment. In providing such a housing and in order to make the device as economical as possible, one has to assure that the assembly process is rapid and simple while maintaining reliability. In this manner, one can reduce the cost of assembly in eliminating various assembly tasks which are performed by relatively skilled labor. Due to the nature of the environment, one also has to assure that the transducer or the semiconductor device is not exposed to the various pollutions or deleterious substances which are present in the atmosphere. A major problem in the transducer art is to supply such a unit which is associated with heavy pins or posts to enable one to plug the unit into a corresponding socket or base or to affix electrical cabling. In so doing, the unit must be capable of being easily inserted and removed in numerous operations without effecting the transducer assembly. In order to solve such problems, the prior art posed many typical solutions. One approach in the prior art was to protect the surface of the transducer with a suitable organic gel or coating. Such coatings do not provide complete protection and further serve to interfere with the transducer operation and response.

The prior art also proposed many different housing configurations in an attempt to isolate the transducer from the environment, while further attempting to provide a hermetic package. Such techniques are relatively complicated in providing housings which consist of numerous parts and are difficult to fabricate and assemble. In particular, one experienced difficulty in the prior art in utilizing heavy conductors such as metal posts or pins in conjunction with a transducer assembly. In such prior art techniques, heavy conductors were either soldered to individual conductors or one utilized hybrid interconnection techniques. These approaches were not optimum in that the interconnections were mechanically weak as requiring multiple bonding techniques, while they were associated with larger resistance due to the hybrid structures. In many techniques, one employed conductive epoxies such as gold epoxies and so on which resulted in additional expense, fabrication difficulties and introudced additional contact reliability problems.

It is therefore an object of the present invention to provide an improved transducer housing, which employs heavy conductors or posts to enable the transducer to operate in conjunction with a suitable socket or base assembly.

BRIEF DESCRIPTION OF THE PREFERRED EMBODIMENT

An electromechanical transducer housing and interconnection assembly, comprising a first top cylindrical housing section having an internal hollow manifested by a top internal section of a given diameter, contiguous with a second concentric section of a larger diameter, with the top surface of said housing as underlying said top internal section providing a force responsive surface, an insulative annular disk member positioned in said hollow and within said second section, with the central aperture of said disk positioned concentrically with said housing sections with the undersurface of said annular member metallized to provide separate contact land areas, with each area associated with and coupled to one depending conductive post relatively parallel to the main axis of said housing, a transducer assembly positioned within said hollow formed by said top section and positioned on the bottom of said top surface, with sensor elements located on the opposite surface of said assembly and having termimals connected to wires with said wires directed through said central aperture and coupled to an associated one of said land areas on said annular member, a second bottom cylindrical housing section having a plurality of apertures aligned with each of said conductive posts, each of said apertures containing an elongated tubular conductor member for accommodating said associated post, with said second housing secured to said top housing section with said posts and said tubular conductor members permanently affixed.

DETAILED DESCRIPTION OF THE INVENTION

Figure 1:
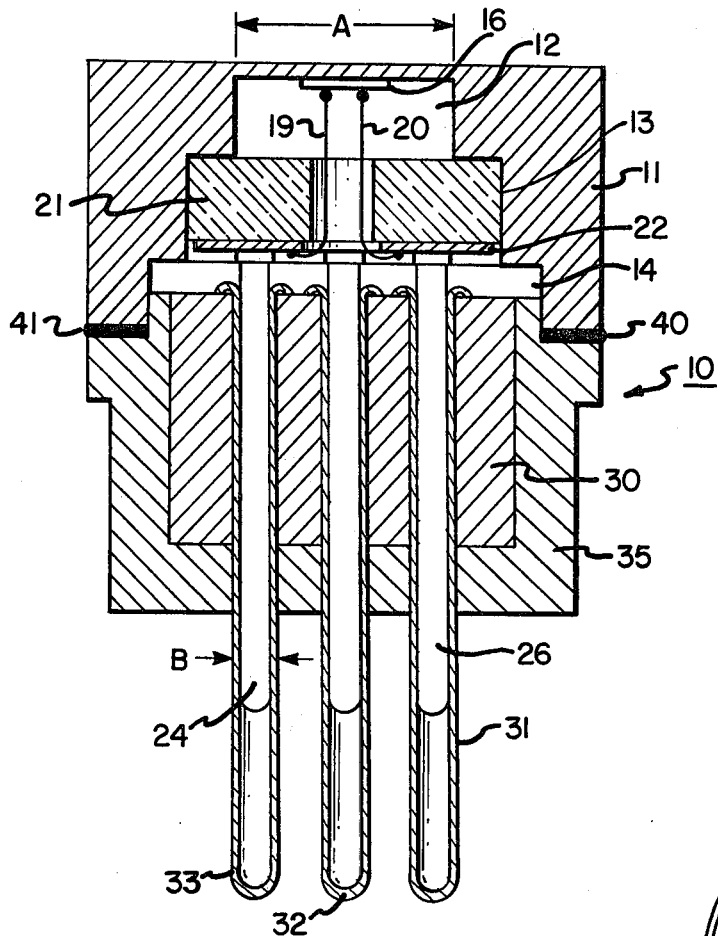
FIG. 1 is a cross sectional side view of a transducer housing.

Referring to FIG. 1, there is shown a housing assembly 10 employed to house a semiconductor transducer configuration. FIG. 1 is a cross sectional view and essentially the components to be described are circular in configuration, thus providing a cylindrical transducer housing structure.

A top housing section 11 is fabricated from a suitable metal and has an internal hollow manifested by three contiguous sections as 12, 13 and 14. Hence, the sidewalls of the top housing section 11 possess a step-like format. This is clearly indicated in the drawings. The central portion A of the top housing section 11 is relatively thin and may, for example, comprise a diaphragm surface. An aperture 15 may be formed in the top surface for communication with a piezoresistive bridge configuration as in FIG. 2. Located within the top hollow section 12 are one or more semiconductor piezoresistive elements 16 or a substrate having deposited on a bottom surface a suitable piezoresistive array. Piezoresistive arrays whcih are located on semiconductor substrates are well known in the art and reference is made to U.S. Pat. No. 3,654,579 issued on Apr. 4, 1972 to A. D. Kurtz, et al and assigned to the Assignee herein. This patent depicts suitable semiconductor transducer structures employing piezoresistive devices and also describes techniques for fabricating the same.

The elements 16 may be conventional semiconductor monolithic elements or may be suitable glass or may be a semiconductor material upon the bottom surface of which are mounted piezoresistive gages. The gages are elements associated with terminals, which terminals have to be brought out to interconnecting pins in order to provide an operating bias to the semiconductor bridge arrangement and to further provide suitable output terminals to enable one to monitor resistance changes in conjunction with applied pressure.

In the above manner, relatively thin wires as 19 and 20, for example, are bonded to the metal terminals on the elements 16. The wires 19 and 20 are directed through an aperture of an annular insulating disk 21 located within section 13 of the stepped housing 11. The disk 21 has a central aperture through which leads 19 and 20 are mounted. The disk is positioned within section 13 of housing 11 and secured in place by the use of an epoxy or other bond. A disc with a central aperture forms a convenient structure but it is understood that other configurations are possible for instance a half-disc configuration is also suitable and eliminates the need for a central aperture.

As indicated, the disk is fabricated from an insulating material such as a ceramic, glass, or printed circuit material. The bottom surface of the disk 21 is metallized or coated by a conventional technique with a conductive material such as an alloy of molybdenum and manganese.

The wires 19 and 20 are soldered, welded or otherwise attached onto the conductive layer 22 which is formed, as indicated, on the bottom surface of the annular member 21. Large metal posts as 24 and 25 are brazed onto the metal layer 22 which is formed on the ceramic disk 21. The brazing of such metal pins onto metal layers is well-known in the art and such techniques, for example, have been employed in the fabrication of transistor housings. Thus, as one can ascertain from FIG. 1, contact is immediately made through the metal layer 22 to the transducer terminal via wires as 19 and 20.

Figure 1A:
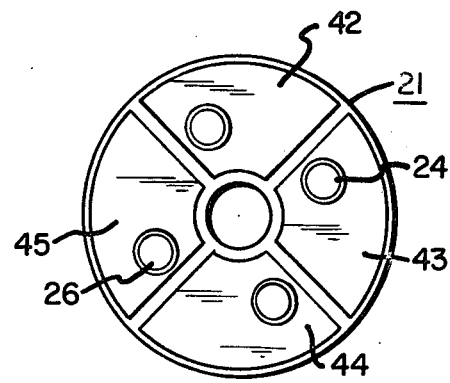
FIG. 1A is a top plan view of the bottom surface of an annular member employed in this invention.

Referring to FIG. 1A, there is shown a bottom plan view of the insulator disk 21. The metallization is formed in four equal area land areas 42, 43, 44 and 45. Each land area has brazed and associated therewith a respective pin as 24 and 26. In this manner, four leads as 19 and 20 are directed from the transducer assembly and soldered within the respective land areas as 42 and 45. It is understood that other methods of fabrication are suitable for this assembly for instance the disc may be of printed circuit construction with etched conductor paths and swaged soldered pins.

A second housing section 30 is shown. Section 30 contains elongated outer metal pins as 31, 32 and 33. These pins are inserted into apertures of housing 30 and positioned and held in place within the apertures by flaring the top edges of the elongated metal tubes at the top surface of the housing 30. The housing 30 is then positioned into communication with the posts and, for example, as shown in FIG. 1, post 24 is accommodated by the tubular member 33, while post 26 is accommodated by the tubular member 31. The posts may be welded to the tubular member by conventional resistive welding. It is immediately apparent that this structure is ideally suited for high temperature operation since all connections can be accomplished by welding.

An outer header or housing 35 having apertures for accommodating tubular members as 31 is then emplaced in the position shown in FIG. 1 and welded to the top section 11 about the periphery thereof designated by numerals 40 and 41.

Thus, as ascertained from FIG. 1, there is provided a transducer housing assembly where small diameter wires 19 and 20 of the transducer assembly are attached directly to a metallic layer deposited on the annular member 21. The metallized area has large conductive posts as 24 attached thereto. These posts are rigidly secured and held in place by the tubular cylindrical members 31 and 33 which are firmly secured to housing 30. In this manner, the posts 24 and 26 are protected against vibration and hence, prevented from dislodging or being removed from the conductive metal layer 22. The tubular posts 31 and 33 are then welded directly to the pins 24 and 26. The welding takes place, for example, at point B and hence, assures that the pins 24 and 26 are in intimate electrical and mechanical contact with the tubular members 32 and 33. It is apparent that the assembly 30, 35, 31–33 can be conventional glass-metal header assembly.

The entire assembly depicted is extremely rugged and can operate, for example, as an automotive transducer. The piezoresistive elements as secured to section 11 may be secured thereto by means of a glass solder bond or a glass frit. The diaphragm 16 has the transducer containing surface away from the environment and hence, prevents contamination to the piezoresistive elements contained thereon. The entire assembly is hermetically sealed as shown in FIG. 1 and hence, provides an extremely rugged structure. The tubular members as 31 can be inserted into a typical socket to enable one to easily change the transducer as desired. The package is relatively simple to fabricate, thus providing a minimum amount of assembly time further leading to an economical transducer product.

Figure 2:
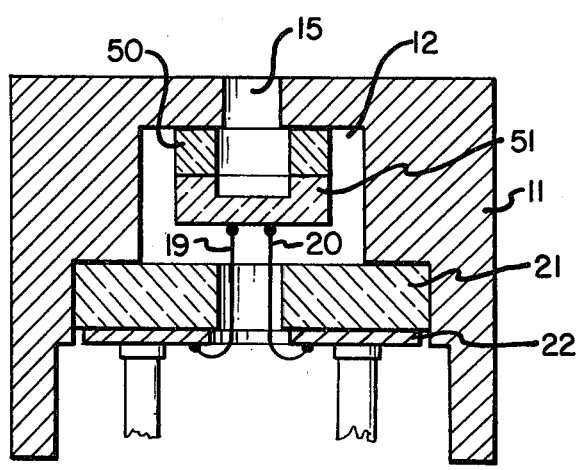
FIG. 2 is a partial cross sectional view of an alternate embodiment according to this invention.

Referring to FIG. 2, there is shown an alternate configuration for mounting a transducer assembly within the top housing section 11. Secured within the hollow 12 of the top section 11 is a first glass ring 50. The ring 50 is coupled to the surface via a solder glass or epoxy bond via soldering or secured to the glass ring 50 is a glass diaphragm member 51 having a cup-like structure manifested by a top peripheral annular ring. Such diaphragm structures are known in the art. See, for example, U.S. Pat. No. 3,753,196 entitled TRANSDUCER EMPLOYING INTEGRAL PROTECTIVE COATINGS AND SUPPORTS issued on Aug. 14, 1973 to A D. Kurtz, et al. and assigned to the Assignee herein.

This patent depicts a mounting technique for a cup-shaped diaphgram assembly.

In FIG. 2, the wires as 19 and 20 which are coupled to the gages mounted on the member 51 are directed through the central aperture of the ceramic annular member 21 onto the metallized bottom surface 22 and soldered in place as shown. The technique is similar to that depicted in FIG. 1 in order to provide the additional housing structure.

The structure of FIG. 2 provides an absolute transducer which has many advantages for the automotive field. The sensor is a diffused piezoresistive silicon diaphragm which has proved reliable and inexpensive. The contamination sensitive diffused surface is not exposed to the harsh environment. Cheap and reliable assembly into a rugged structure is accomplished by this invention.

If a gage or vented structure is desired an additional aperture may be provided as assembly 30-35 or alternately an additional open ended tubular member may be provided in this assembly.

Many modifications and alternate configurations will become apparent to those skilled in the art when reading the above noted specification. All such structures are deemed to be encompassed within the scope and breadth of the claims appended hereto.

We claim:

1. An electromechanical transducer housing and interconnection assembly, comprising:
   (a) a first top cylindrical housing section having an internal hollow manifested by a top internal section of a given diameter, contiguous with a second concentric section of a larger diameter, with the top surface of said housing as under lying said top internal section providing a force responsive surface,
   (b) an insulative annular member positioned in said hollow and within said second section with the central aperture of said annular member positioned concentrically with said housing sections, with the undersurface of said annular member metallized to provide separate contact land areas, with each area associated with and coupled to one depending conductive post relatively parallel to the main axis of said housing,
   (c) a transducer assembly positioned within said hollow formed by said top section and positioned on the bottom of said force responsive surface, with sensor elements located on the opposite surface of said assembly said sensor elements having terminals with said terminals connected to wires with said wires directed through said central aperture of said annular member and coupled to an associated one of said land areas on said annular member,
   (d) a second bottom cylindrical housing section having a plurality of apertures aligned with each of said conductive posts, each of said apertures containing an elongated tubular conductor member for accommodating said associated post, with said second housing secured to said top housing section with said posts and said tubular conductor members permanently affixed.

2. The electromechanical transducer housing according to claim 1 wherein said insulative annular disk is fabricated from a ceramic with said undersurface metallized with a molybdenum manganese layer.

3. The electromechanical transducer housing according to claim 1 wherein said transducer assembly has a planar base with the top surface of said assembly bonded to said bottom of said force responsive surface by a glass bond.

4. The electromechanical transducer housing according to claim 3 wherein the bottom surface of said transducer assembly contains at least one piezoresistive element.

5. The electromechanical transducer housing according to claim 1 further including an outer housing section having a large central aperture for containing said second bottom cylindrical housing section with the bottom surface of said outer housing section having an aperture for receiving said elongated tubular conductor members.

6. The electromechanical transducer housing according to claim 1 wherein each post is welded to said associated tubular conductor member.

7. The electromechanical transducer housing according to claim 1 wherein said annular member contains four equal area contact land areas.

8. The electromechanical transducer housing according to claim 1 wherein said first and second housing sections are fabricated from a metal and are welded together.

9. The electromechanical transducer housing according to claim 1 wherein said posts are coupled to said associated land area by brazing the post to the metallization.

10. The electromechanical transducer housing according to claim 1 wherein said top surface of said first housing section has an aperture for communicating with said transducer assembly.

* * * * *